United States Patent
Han

(10) Patent No.: US 6,556,488 B2
(45) Date of Patent: Apr. 29, 2003

(54) DELAY LOCKED LOOP FOR USE IN SEMICONDUCTOR MEMORY DEVICE

(75) Inventor: Jong-Hee Han, Ichon-shi (KR)

(73) Assignee: Hynix Semiconductor, Seoul (KR)

( * ) Notice: Subject to any disclaimer, the term of this patent is extended or adjusted under 35 U.S.C. 154(b) by 0 days.

(21) Appl. No.: 09/742,816

(22) Filed: Dec. 19, 2000

(65) Prior Publication Data

US 2001/0021130 A1 Sep. 13, 2001

(30) Foreign Application Priority Data

Dec. 30, 1999 (KR) .............................. 99-66815

(51) Int. Cl.$^7$ ................................. G11C 7/00
(52) U.S. Cl. ..................... 365/194; 365/233; 327/158
(58) Field of Search ................ 365/194, 233, 365/189.01, 230.01; 327/158

(56) References Cited

U.S. PATENT DOCUMENTS 5,087,829 A * 2/1992 Ishibashi et al. ............ 327/158
5,745,533 A * 4/1998 Asada et al. ................. 327/161
6,081,142 A * 6/2000 Douchi et al. ............... 327/158

* cited by examiner

*Primary Examiner*—Hoai Ho
(74) *Attorney, Agent, or Firm*—Townsend and Townsend and Crew LLP

(57) ABSTRACT

A delay locked loop is used in a semiconductor memory device. The delay locked loop includes a controllable delay chain block for controlling a delay time of a clock signal coupled thereto, a comparison block for detecting the increase and decrease in the delay time by comparing a reference clock signal with a delayed clock signal generated from the controllable delay chain block, and an instant locking delay control block for controlling the increase and decrease in the delay time of the delay chain block in response to an output signal of the comparison block, the delayed clock signal and the reference clock signal.

18 Claims, 10 Drawing Sheets

DELAY LOCKED LOOP FOR USE IN SEMICONDUCTOR MEMORY DEVICE

FIELD OF THE INVENTION

The present invention relates to a semiconductor memory device; particularly to a time delay locked loop having a short locking time.

BACKGROUND OF THE INVENTION

In general, a delay locked loop represents a circuit that is used to synchronize an internal clock of a synchronous memory device with an external clock without errors. That is, since a timing delay occurs when the external clock is inputted into the inside of the memory device, the delay locked loop is used to control the timing delay to thereby synchronize the internal clock with the external clock.

Referring to FIG. 1, there is illustrated a block diagram of a conventional delay locked loop.

If a clock signal Clock_1 is coupled thereto, a controllable delay chain block 100 delays the clock signal Clock_1 by a predetermined delay time to thereby produce a delayed clock signal Delayed_clock.

The delayed clock signal Delayed_clock is fed to a pre-delay/post-delay comparison block 110 that compares the delayed clock signal Delayed_clock with a reference clock signal Reference_clock to thereby determine whether increasing or decreasing the predetermined delay time is required. Through the comparison process, the pre-delay/post-delay/comparison block 110 generates output signals Add_delay and Subtract_delay that are, in turn, fed back to the controllable delay chain block 100 so as to adjust the delay time.

The above delay and comparison processes are repeated until a delayed time of the delayed clock signal Delayed_clock is identical to that of the reference clock signal Reference_clock.

Referring to FIG. 2, there is shown a block diagram of a conventional time delay locked loop employing a careful delay controller.

Once a clock signal Clock_1 is coupled thereto, a controllable delay chain block 200 generates a delayed clock signal Delayed_clock by delaying the clock signal Clock_1 and the delayed clock signal Delayed_clock is provided to a predelay/post-delay comparison block 210.

The pre-delay/post-delay comparison block 210 compares the delayed clock signal Delayed_clock with a reference clock signal Reference_clock so as to determine whether increasing or decreasing the delay time of the delayed clock signal Delayed_clock is necessary. As a result of the comparison process, the pre-delay/post-delay comparison block 210 produces output signals Add_delay_i and Sub_delay_i to a careful delay controller 220.

The careful delay controller 220 is employed to preclude an incorrect determination for the delay time, wherein the incorrect determination may occur by a noise introduced by the power supply or an irregular noise at a system. That is, the delay controller 220 controls the controllable delay chain block 200 to change the delay time only when the delay time determination satisfies a predetermined standard by collecting the results of more than two continuous determination processes instead of directly applying the result of the pre-delay/post-delay comparison block 210 to change the delay time. The output signals Add_delay and Subtract_delay of the delay controller 220 are fed back to the controllable delay chain block 20 to thereby adjust the delay time.

As described above, the conventional delay locked loop of FIG. 2 is insensitive to noise at the state when the delayed locked loop normally operates and the locking is done. However, there is a disadvantage that it takes a very long time from an initial condition in which the locking is not caused to the locking: That is, since, in order to adjust the time delay, there must be at least two determination processes for the increase or decrease in the delay time generated by the pre-delay/post-delay comparison block 210, the time required for the locking may be much longer compared with that of using only one time of determination, as in the delay locked loop of FIG. 1.

SUMMARY OF THE INVENTION

It is, therefore, a primary object of the present invention to provide a time delay locked loop which classifies a locking state of the delay locked loop into a locked state and a unlocked state, and either uses a conventional time delay adjusting method in the unlocked state or reduces or eliminates a incorrect determination of the locking introduced by a noise in the locked state.

In accordance with the present invention, there is provided a delay locked loop for use in a semiconductor memory device, comprising: a controllable delay chain block for controlling a delay time of a clock signal coupled thereto; a comparison block for detecting the increase and decrease in the delay time by comparing a reference clock signal with a delayed clock signal generated from the controllable delay chain block; and an instant locking delay control block for controlling the increase and decrease in the delay time of the delay chain block in response to an output signal of the comparison block, the delayed clock signal and the reference clock signal.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, with reference to the drawings, some of the preferred embodiments of the present invention will be explained in detail.

Figure 3:
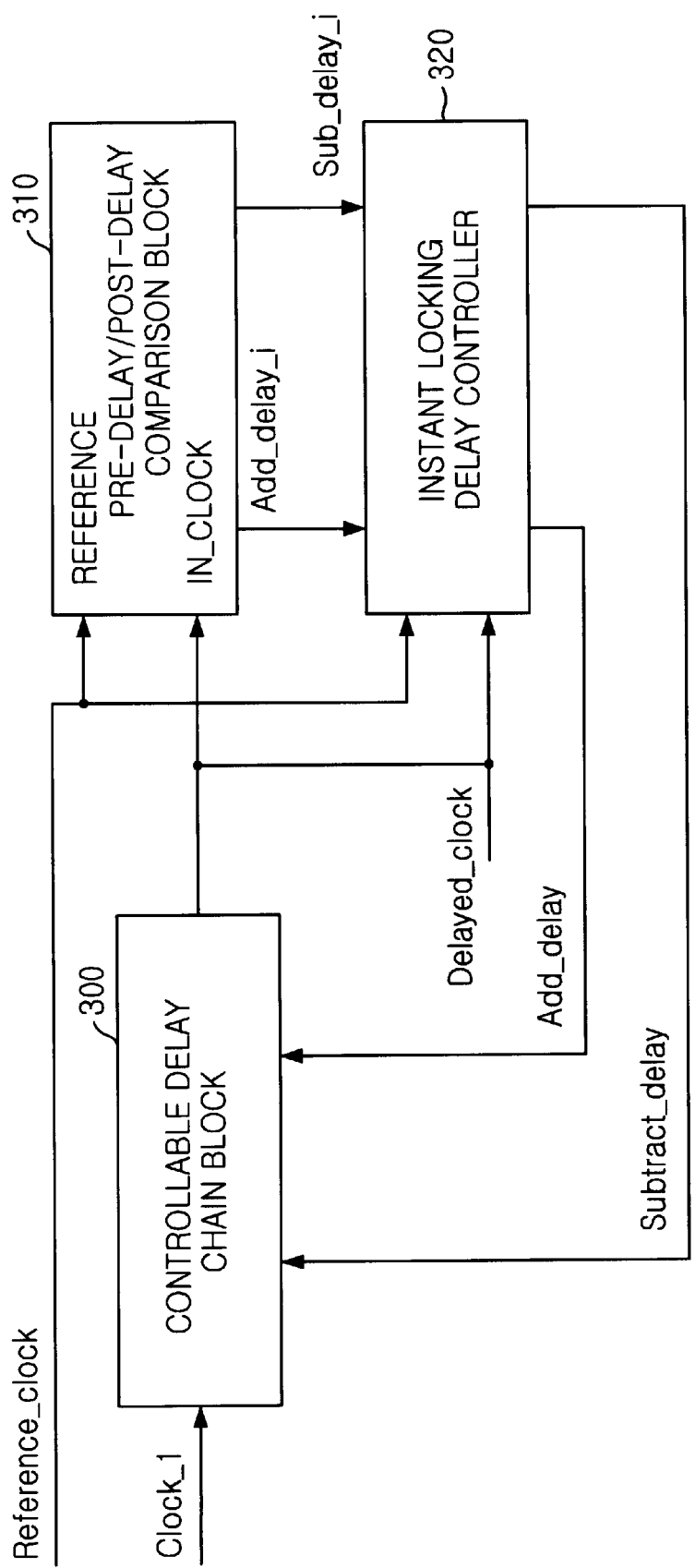
FIG. 3 is a block diagram of a delay locked loop in accordance with the present invention.

Referring to FIG. 3, there is illustrated a block diagram of a delay locked loop in accordance with the present invention.

The delay locked loop comprises a controllable delay chain block 300 for adjusting a delay time of a clock in response to output signals Add_delay and Subtract_delay of an instant locking delay controller 320, a pre-delay/post-delay comparison block 310 for determining the need for increase or decrease of the delay time by comparing a delayed clock signal Delayed_clock output from the controllable delay chain block 300 with a reference clock signal Reference_clock, and the instant locking delay controller 320 for generating the output signals Add_delay and Subtract_delay by using output signals Add_delay_i and Sub_delay_i of the pre-delay/post-delay comparison block 310, the delayed clock signal Delayed_clock and the reference clock signal Reference_clock, wherein the output signals Add_delay and Subtract_delay are used to control the increase and decrease of the delay time at the controllable delay chain block 300.

Figure 1:
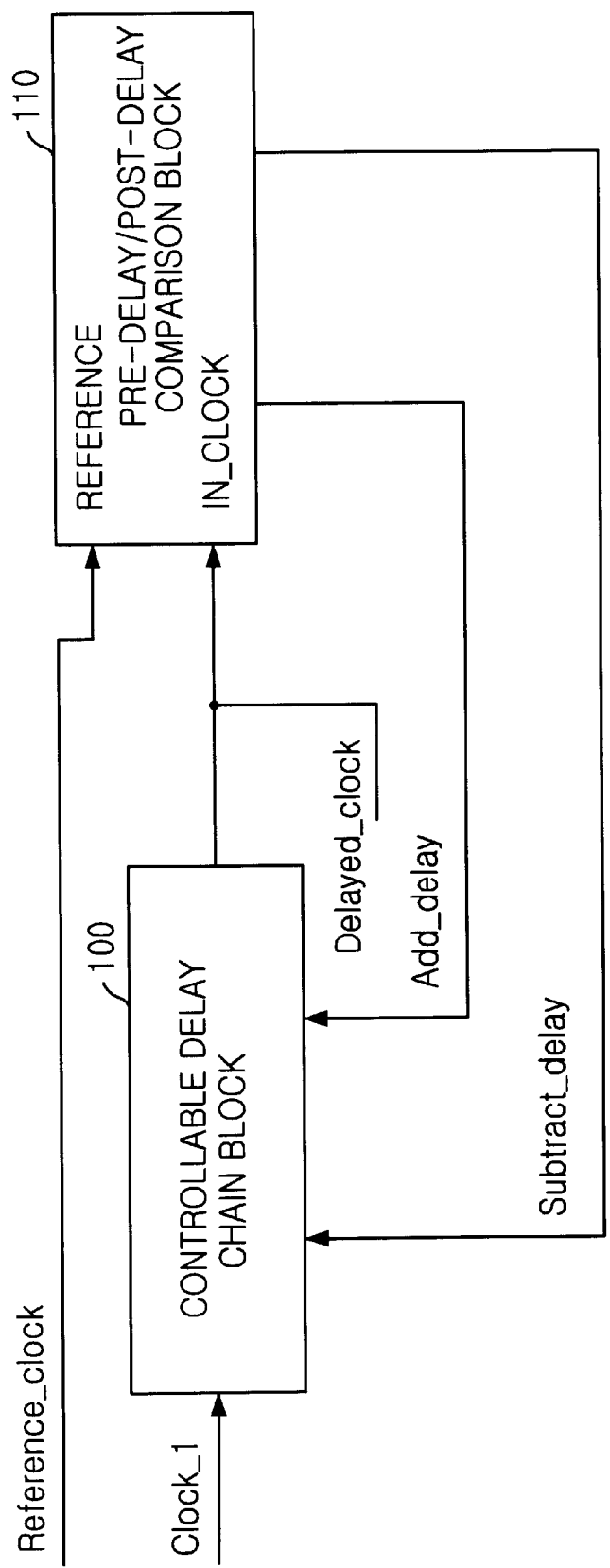
FIG. 1 illustrates a block diagram of a conventional delay locked loop.
Figure 2:
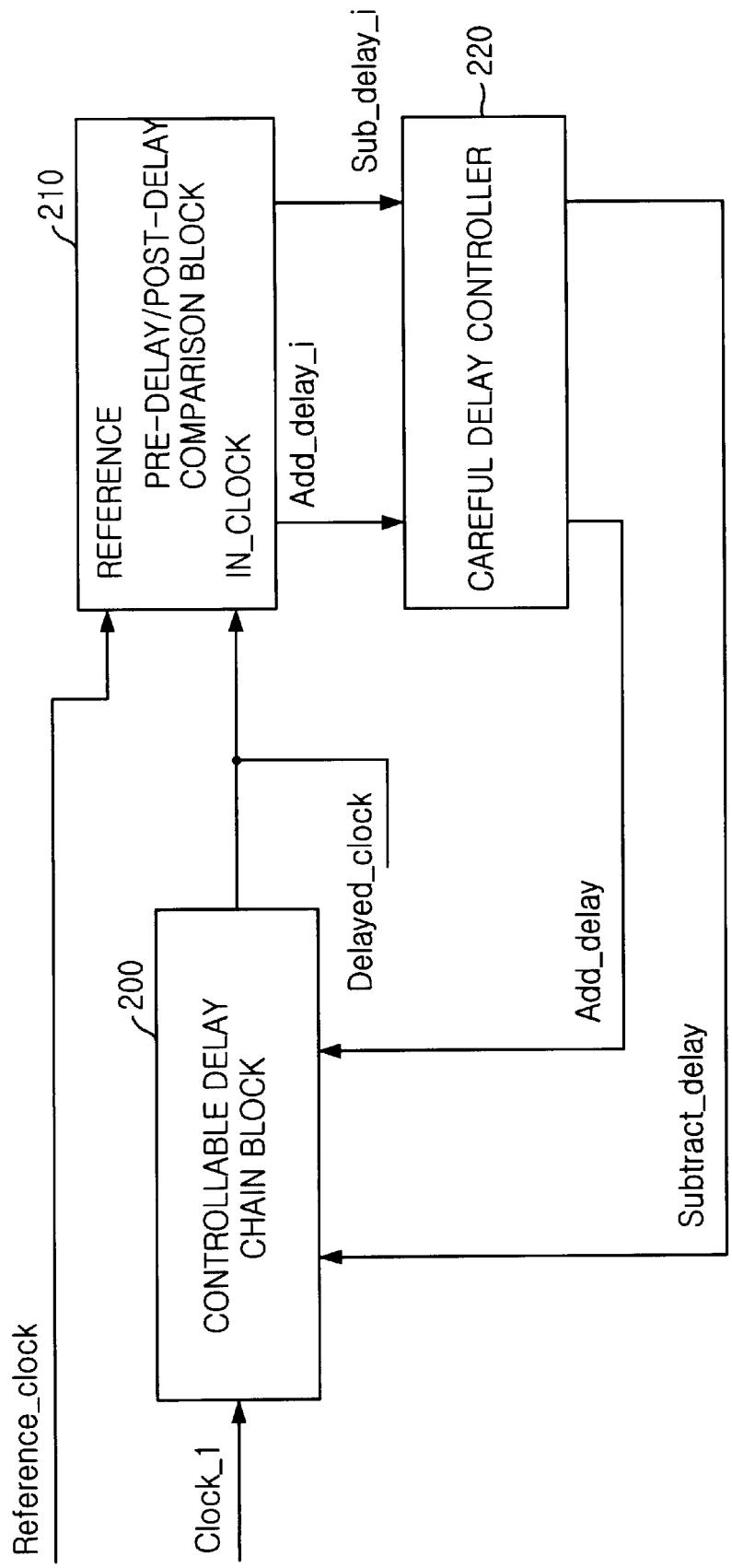
FIG. 2 shows a conventional delay locked loop employing a careful delay controller.

Unlike the conventional delay locked loop described in FIG. 2, in the inventive delay locked loop shown in FIG. 3, the delayed clock signal Delayed_clock and the reference clock, signal Reference_clock are coupled to both the pre-delay/post-delay comparison block 310 and the instant locking delay controller 320 in parallel. Therefore, the instant locking delay controller 320 can check whether the locking is accomplished or not by comparing the delayed clock signal Delayed_clock and the reference clock signal Reference_clock. the instant locking delay controller 320 in accordance with the present invention.

The instant locking delay controller 320 comprises a conventional careful delay controller 410, a shift multiplexer 420 and a locking detector 430.

The locking detector 430 compares the reference clock signal Reference_clock with the time delayed clock signal Delayed_clock to thereby check whether a time difference between the reference clock signal Reference_clock and the time delayed clock signal Delayed_clock is locked in a predetermined range. The output signals Add_delay_i and Sub_delay_i of the pre-delay/post-delay comparison block are inputted to the careful delay controller 410 that generates output signals Add_delay_int and Sub_delay_int compensating the locking due to a noise. The signals Add_delay_i and Sub_delay_i are also coupled to the shift multiplexer 420.

Then, the shift multiplexer 420 selects one of the inputted signals Add_delay_i and Sub_delay_i and chooses one of the inputted signals Add_delay_int and Sub_delay_int. At this time, if the locking detector 430 determines that the reference clock signal Reference_clock and the time delayed clock signal Delayed_clock are sufficiently locked, the shift multiplexer 420 determines an instruction provided from the careful delay controller 410 as a final time delay instruction, and, if otherwise, the shift multiplexer 420 decides an instruction coupled from the pre-delay/post-delay comparison block 310 as the final time delay instruction.

The locking detector 430 generates a signal Rough_lock_flag controlling the shift multiplexer 420 based on the reference clock signal Reference_clock and the time delayed clock signal Delayed_clock.

Figure 4:
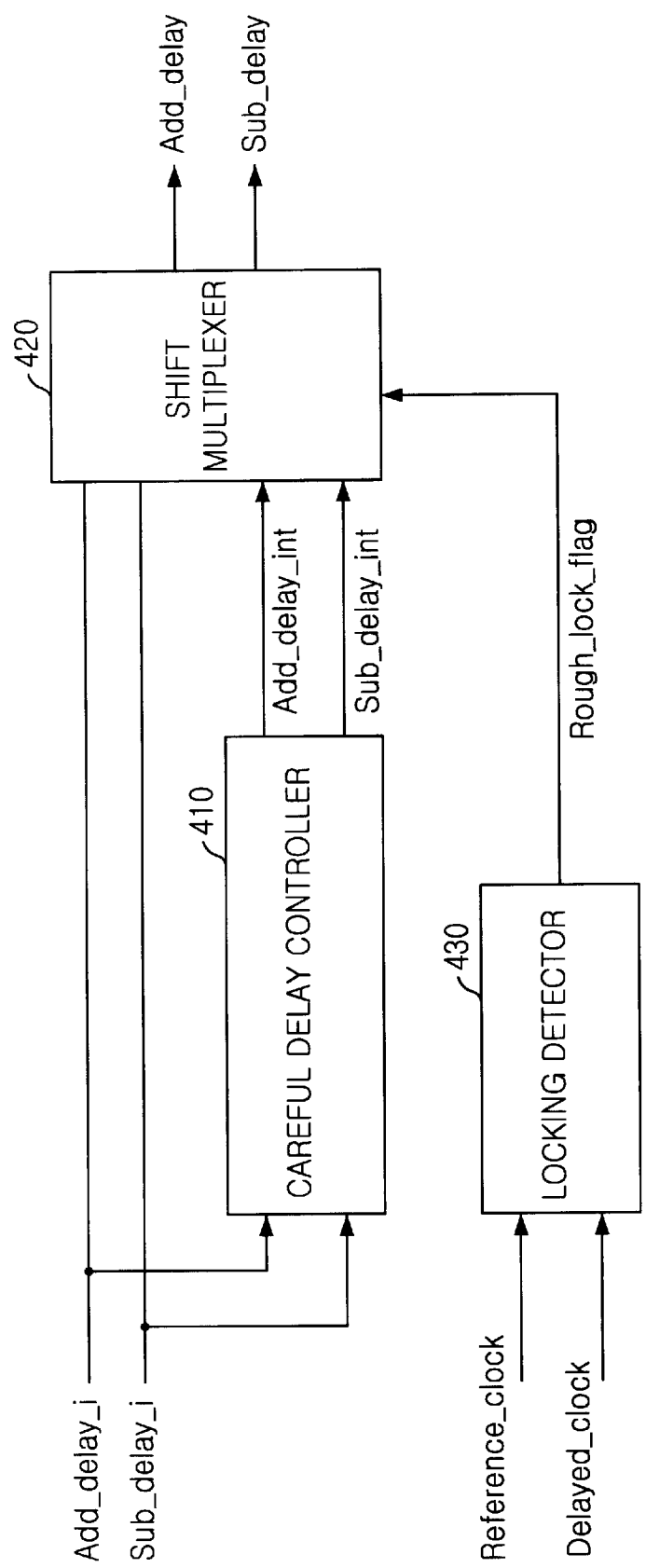
FIG. 4 provides a block diagram of an instant locking delay controller in accordance with the present invention.
Figure 5:
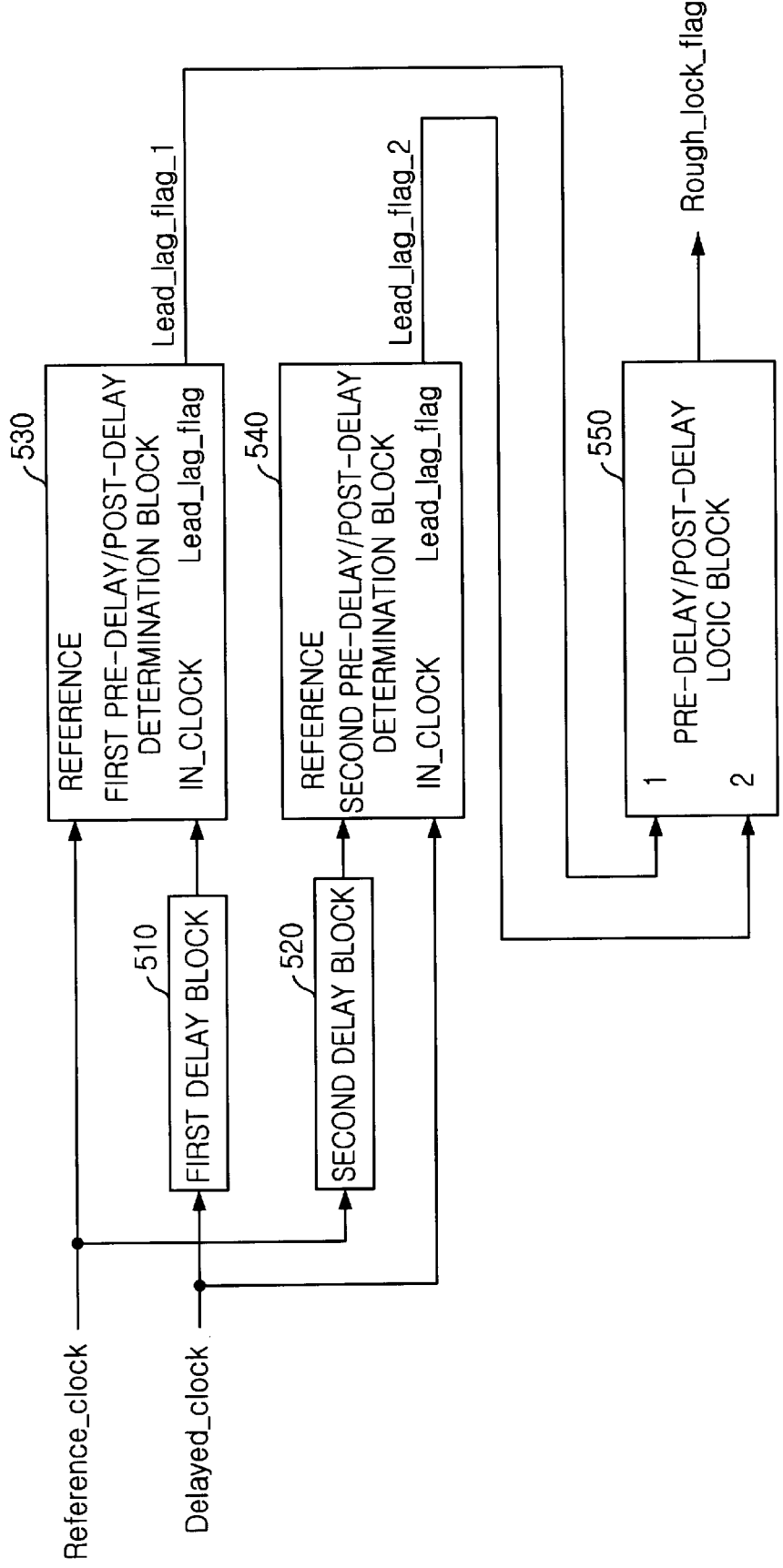
FIG. 5 depicts a block diagram of a locking detector in accordance with the present invention.

Referring to FIG. 5, there is shown an exemplary block diagram of the locking detector 430 in FIG. 4.

The locking detector 430 comprises a first predelay/post-delay determination block 530 which receives the reference clock signal Reference_clock and a signal provided from a first delay block 510 which delays the time delayed clock signal Delayed_clock by a predetermined delay time; a second pre-delay/post-delay determination block 540 which receives the time delayed clock signal Delayed_clock and a signal supplied from a second delay block 520 which delays the reference clock signal Reference_clock by a preset delay time; and a pre-delay/post-delay logic block 550 generates the control signal Rough_lock_flag by using output signals Lead_lag_flag_1 and Lead_lag_flag_2 of the first and the second pre-delay/post-delay determination blocks 530 and 540.

The first pre-delay/post-delay determination block 530 is provided with the reference clock signal Reference_clock and the signal S1 outputted from the first delay block 510 delaying the time delayed clock signal Delayed_clock by the predetermined delay time, and compares the reference clock signal Reference_clock and the signal S1. If the reference clock signal Reference_clock is slower than the signal S1, it means that the time delayed clock signal Delayed_clock goes ahead a predetermined time compared with the reference clock signal Reference_clock. Therefore, in order to determine that the time delayed signal Delayed_clock and the reference clock signal Reference_clock are locked, it should be determined that the signal S1 is slower than the reference clock signal Reference_clock.

The second pre-delay/post-delay determination block 540 is provided with the time delayed clock signal Delayed_clock and the signal R1 outputted from the second delay block 520 delaying the reference clock signal Reference_clock by the preset delay time and compares the time delayed clock signal Delayed_clock and the signal R1. If the signal R1 is faster than the time delayed clock signal Delayed_clock, it means that the time delayed clock signal Delayed_clock is behind the predetermined time compared with the reference clock signal Reference_clock. Accordingly, in order to determine that the time delayed signal Delayed_clock and the reference clock signal Reference_clock are locked, it should be determined that the signal R1 is slower than the time delayed clock signal Delayed_clock.

The pre-delay/post-delay logic block 550 checks whether or not the second pre-delay/post-delay determination block 540 determines that the signal R1 is slower than the time delayed clock signal Delayed_clock and whether or not the first pre-delay/post-delay determination block 530 determines that the signal S1 is slower than the reference clock signal Reference_clock. If all of the above requirements are satisfied, the pre-delay/post-delay logic block 550 determines that the locking is achieved and, if otherwise, decides that the locking is not achieved. As a result, the selection signal Rough_lock_flag representing whether the locking is achieved or not is outputted to the shift multiplexer 420.

Figure 6:
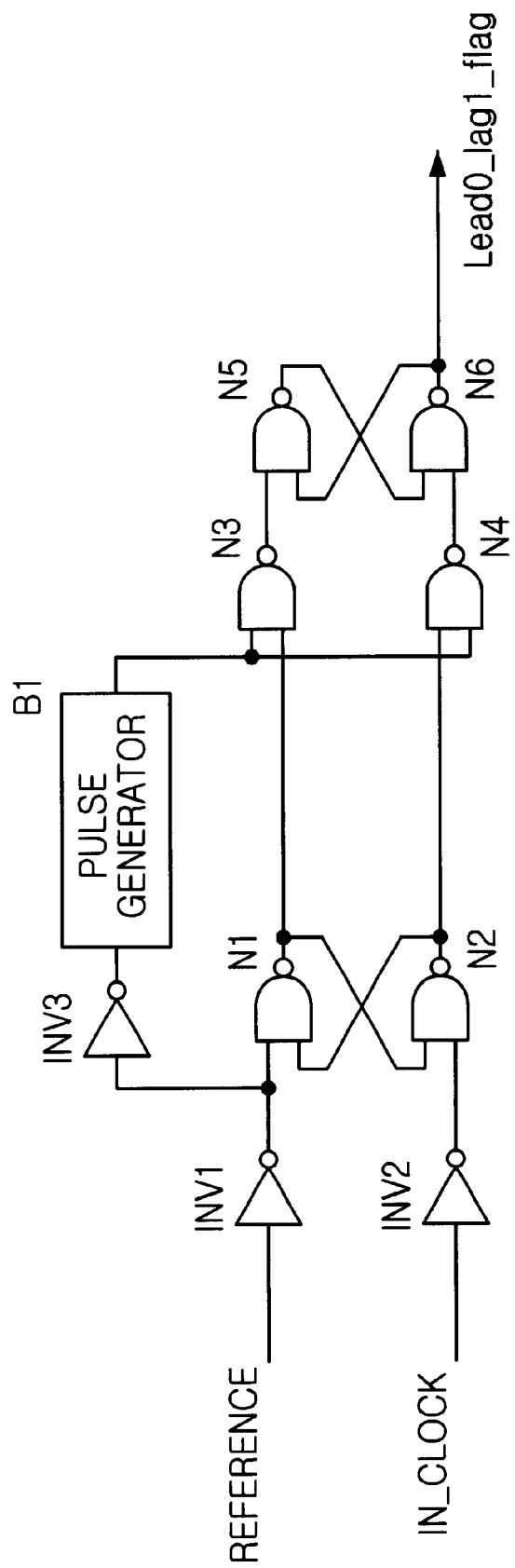
FIG. 6 represents a block diagram of a pre-delay/post-delay determination block in FIG. 5.

Referring to FIG. 6, there is described an exemplary circuit diagram of the pre-delay/post-delay determination block 530 or 540 in FIG. 5 which is capable of detecting the first and last of falling edges of the reference clock signal Reference_clock and the time delayed clock signal Delayed_clock.

A reference signal REFERENCE is inverted at a first inverter INV1 and the inverted signal is inputted into a first input node of a first NAND gate N1. An output signal of the first NAND gate N1 is fed to a first input node of a second NAND gate N2.

Meanwhile, a clock signal IN_CLOCK is inverted at a second inverter INV2 and then the inverted signal is coupled to a second input node of the second NAND gate N2. An output signal of the second NAND gate N2 is fed to a second input node of the first NAND gate N1.

The inverted signal generated from the first inverter INV1 is provided into a third inverter INV3 and an output signal of the third inverter INV3 is fed to a pulse generator B1. Then, an output signal of the pulse generator B1 is coupled to a first input node of a third NAND gate N3 and a second input node of a fourth NAND gate N4 in parallel.

The output signal of the first NAND gate N1 is provided into a second input node of the third NAND gate N3 and the output signal of the second NAND gate N2 is supplied into a first input node of the fourth NAND gate N4. Output signals of the third and the fourth NAND gates N3 and N4 are provided to a fifth and a sixth NAND gates N5 and N6, respectively. An output signal of the fifth NAND gate N5 is inputted to the sixth NAND gate N6, and an output signal of the sixth NAND gate N6 is fed to the fifth NAND gate N5 to be latched and also generated as a determination signal Lead0_lag1_flag.

The first latch consisting of the first NAND gate N1 and the second NAND gate N2 is a circuit for detecting the first and last of falling edges of the reference signal REFERENCE and the clock signal IN_CLOCK.

The third latch made of the fifth NAND gate N5 and the sixth NAND gate N6 has a function of storing the data of the first latch.

The second latch composed of the third NAND gate N3 and the fourth NAND gate N4 is a gate for delivering the data of the first latch to the third latch.

The pulse generator B1 produces a signal that is enabled to transfer the data of the first latch when the first latch finishes its comparison process.

Figure 7:
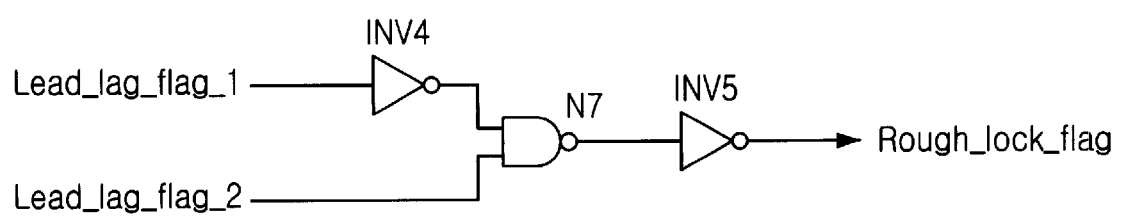
FIG. 7 describes a block diagram of a pre-delay/post-delay logic block in FIG. 5.

In FIG. 7, there is depicted a detailed circuit diagram of the pre-delay/post-delay logic block 550 illustrated in FIG. 5.

The determination signal Lead_lag_flag_1 outputted from the first pre-delay/post-delay determination block 530 is inverted by an inverter INV4 and then coupled to one input node of a NAND gate N7. The signal Lead_lag_flag_2 generated from the second pre-delay/post-delay determination block 540 is fed to the other input node of the NAND gate N7. An output signal of the NAND gate N7 is inverted by an inverter INV5 and then outputted as the selection signal Rough_lock_flag controlling the shift multiplexer 420.

For instance, in the first and the second determination blocks 530 and 540, it is assumed that, if a signal that is compared with a reference signal is faster than the reference signal, an output thereof has a logic low state and, if otherwise, the output has a logic high state. According to the assumption, when the second pre-delay/post-delay determination block 540 determines that the signal R1 is slower than the time delayed clock signal Delayed_clock and the first pre-delay/post-delay determination block 530 decides that the signal S1 is slower than the reference clock signal Reference_clock, the first and the second determination blocks 530 and 540 generate output signals having the logic high state. If otherwise, the first and the second determination blocks 530 and 540 generate output signals having the logic low state.

Figure 8:
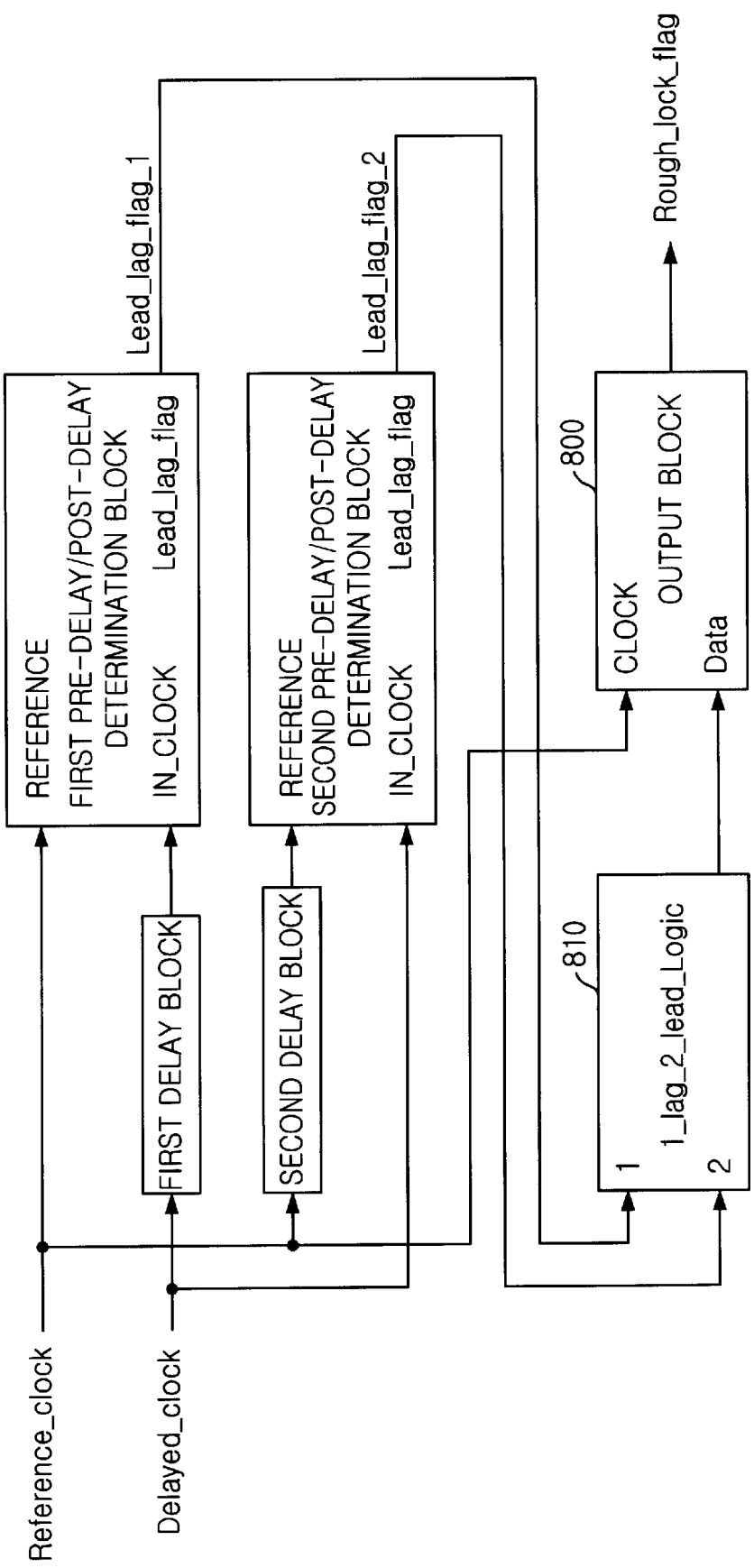
FIG. 8 is a block diagram of a locking detector further including an output block in accordance with the present invention.

In FIG. 8, there is shown a block diagram further including an output block 800 in addition to the locking detector 430.

The locking detector 430 is a circuit for checking whether the locking is accomplished or not and the locking range car be relatively wide. In this case, although the locking detector 430 determines that the locking is achieved, it takes much longer time to accomplish a maximum locking which can be induced by the delay locking loop.

If the careful delay controller 410 is used as soon as the locking detector 430 determines that the locking is accomplished, the entire locking time may become longer. Therefore, information representing that the locking is achieved should be outputted after a given time. On the other hand, information representing that the locking is not accomplished should be outputted without any delay.

In order to provide a signal representing an unlocked state without delay while providing a signal representing a locked state only after a given time, output block 800 may be used. Output block 800 receives the time delayed clock signal Delayed-clock and delays the output signal of the pre-delay/post-delay logic block 550 by one or more than one clock cycles. Further, if information showing that the locking is not accomplished at the pre-delay/post-delay logic block 550 is coupled thereto, the output block 800 immediately deactivates the selection signal Rough_lock_flag that controls the shift multiplexer to thereby make the careful delay controller 410 not be used.

Figure 9:
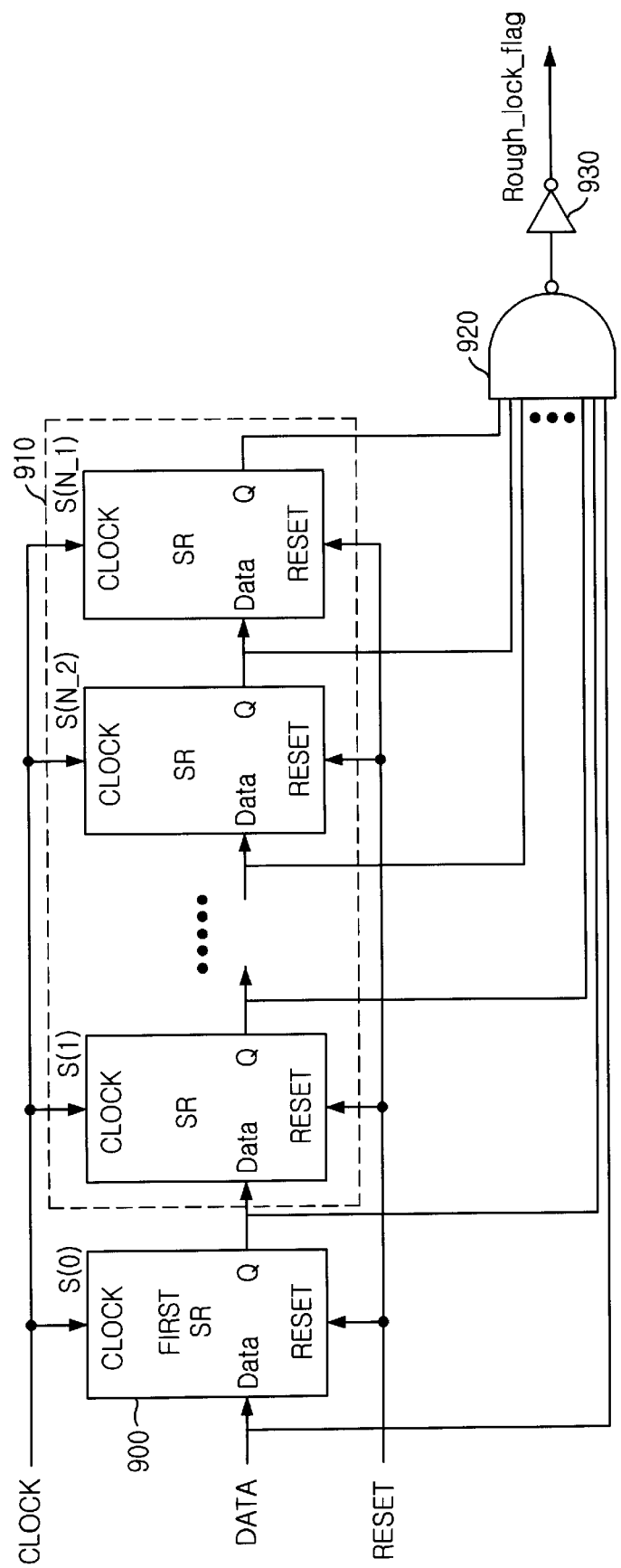
FIG. 9 shows a block diagram of the output block in accordance with one embodiment of the present invention.

Referring to FIG. 9, there is described one embodiment of the output block 800. In accordance with this embodiment, several shift registers are connected to each other in series. The output block 800 comprises a first shift register 900 receiving as inputs a reference clock signal CLOCK of synchronizing the registers, the output signal DATA of the pre-delay/post-delay logic block 550 and a reset signal RESET; a plurality of shift registers 910 serially connected to the first shift register 900 and receiving the reference clock signal CLOCK and the reset signal RESET; a NAND gate 920 performing a negative AND operation for the output signal DATA of the pre-delay/post-delay logic block 550 and shifted signals generated from the plurality of shift registers 910; and an inverter 930 outputting the selection signal Rough_lock_flag by inverting an output of the NAND gate 920.

The first shift register 900 receives as its input the signal DATA generated from the pre-delay/post-delay logic block 810 and the inputted signal DATA is shifted to a next shift register in response to the clock signal CLOCK. The shift registers are initialized by the reset signal RESET. The NAND gate 920 generates information representing that the locking is accomplished when the inputted signal DATA passes a predetermined number of shift registers. Information describing that the locking is not accomplished is outputted without passing the shift registers.

Figure 10:
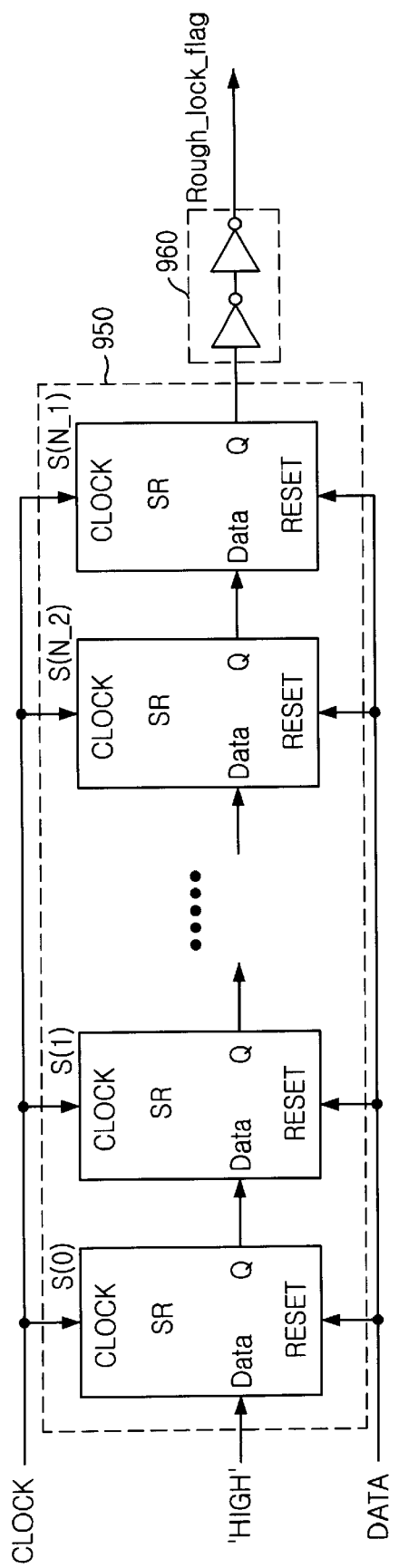
FIG. 10 is illustrated a block diagram of the output block in accordance with another embodiment of the present invention.

In FIG. 10, there is illustrated a block diagram of the output block 800 in accordance with another embodiment of the present invention.

The output block 800 comprises a multiplicity of shift registers 950 connected to each other in series which receive a clock signal CLOCK of synchronizing registers and the output signal DATA of the pre-delay/post-delay logic block 550 as a reset signal. An input of the first shift register is fixed as a logic high state, and a shifted signal produced from the final shift register is delayed by a delay unit 960 and outputted as the selection signal Rough_Lock_flag.

As described above, in a delay locked loop of a semiconductor memory device in accordance with the present invention, by using different circuits depending on whether the locking is completed or not, i.e., using the careful delay controller when the locking is accomplished and not using the careful delay controller when the locking is not completed, it is possible to obtain a short locking time when the locking is not accomplished and to reduce an incorrect locking determination due to noise by using the careful delay controller when the locking is done.

While the present invention has been described with respect to the particular embodiments, it will be apparent to those skilled in the art that various changes and modifications may be made without departing from the spirit and scope of the invention as defined in the following claims.

What is claimed is:

1. A delay locked loop for use in a semiconductor memory device, comprising:

a controllable delay chain means for controlling a delay time of a clock signal coupled thereto;

a comparison means for comparing a reference clock signal with a delayed clock signal generated from the controllable delay chain means and detecting a need for an increase or decrease of the delay time; and an instant locking delay control means for detecting whether a locking between the reference clock signal and the delayed clock signal is accomplished, wherein, when the locking is accomplished, the instant locking delay control means is operated to compensate for noise detected by the comparison means and to control the controllable delay chain means, and wherein, when the locking is not accomplished, the instant locking delay control means is not operated to compensate for noise and the output signals generated by the comparison means are used to directly control the controllable delay chain means.

2. The delay locked loop of claim 1, wherein the instant locking delay control means includes:

a delay controller for counting a number of times the output signal of the comparison means is activated and generating a signal requesting an increase or decrease of the delay time if the counted number is larger than a predetermined value;

a locking detector for detecting, in response to the reference clock signal and the delayed clock signal, whether the locking is accomplished and generating a selection signal representing whether the locking is accomplished; and a shift multiplexer for selectively outputting one of the output signal of the comparison means and the output signal of the delay controller in response to the selection signal, thereby controlling the controllable delay chain means.

3. The delay locked loop of claim 2, wherein the locking detector comprises:

a first delay unit for delaying the delayed clock signal by a predetermined time to thereby generate a delayed output signal;

a second delay unit for delaying the reference clock signal by a preset time to thereby produce a delayed reference clock signal;

a first determination unit for determining, in response to the reference clock signal and the delayed output signal, whether the delayed output signal is slower than the reference clock signal;

a second determination unit for deciding, in response to the delayed clock signal and the delayed reference clock signal, whether the delayed reference clock signal is slower than the delayed clock signal; and a logic unit for generating the selection signal based on output signals of the first and the second determination units.

4. The delay locked loop of claim 3, wherein the locking detector further comprises an output unit for delaying, in response to the reference clock signal, an output signal of the logic unit when the locking is accomplished, to thereby control the shift multiplexer.

5. The delay locked loop of claim 4, wherein the output unit comprises:

a plurality of shift registers configured to shift the output signal of the logic unit and to be reset;

a NAND gate for performing a negative AND operation for shifted values of the plurality of shift registers;

and an inverter for producing the selection signal by inverting an output of the NAND gate.

6. The delay locked loop of claim 4, wherein the output unit comprises:

a plurality of shift registers configured to receive the output signal of the logic unit as their reset signal and to shift a high data value input to a first of the registers; and an output means for generating a data value output from the last one of the shift registers as the selection signal.

7. In a delay locked loop, a delay control circuit for generating a control signal for causing an increase or decrease in a delay time of a delayed clock signal, comprising:

a time-offset detector coupled to the delayed clock signal and a reference clock signal and configured to generate a first adjustment signal indicating a need for an increase or decrease of the delay time;

a delay controller coupled to the first adjustment signal and configured to generate a second adjustment signal by applying noise compensation to the first adjustment signal;

a locking detector coupled to the delayed clock signal and the reference signal and configured to assert a lock signal when a locking condition is satisfied; and a selector configured to provide one of the first and second adjustment signals as the control signal in response to the lock signal.

8. The delay control circuit of claim 7, wherein the selector comprises a shift multiplexer having first and second input terminals coupled to receive the first and second adjustment signals respectively, and a control terminal coupled to receive the lock signal.

9. The delay control circuit of claim 7, wherein the locking detector comprises:

a first delay unit configured to further delay the delayed clock signal;

a second delay unit configured to delay the reference clock signal;

a first time-offset detector coupled to receive the reference clock signal and an output signal of the first delay unit and configured to assert a first flag signal when the output of the first delay unit arrives after the reference clock signal;

a second time-offset detector coupled to receive the delayed clock signal and an output signal of the second delay unit and configured to assert a second flag signal when the output of the second delay unit arrives after the delayed clock signal; and a delay logic block coupled to receive the first and second flag signals and to assert a third flag signal when both the first and second flag signals are asserted, the third flag signal indicating whether the locking condition is achieved.

10. The delay control circuit of claim 9, wherein the first time-offset detector comprises:
- a first latch configured to detect falling edges of the reference clock signal and the output signal of the first delay unit;
- a second latch having input terminals coupled to respective output terminals of the first latch and an enable terminal;
- a pulse generator, responsive to the reference clock signal, having an output terminal coupled to the enable terminal of the second latch; and
- a third latch having input terminals coupled to respective output terminals of the second latch and an output terminal that provides the first flag signal.

11. The delay control circuit of claim 9, wherein the delay logic block comprises:
- a first inverter configured to invert the first flag signal;
- a NAND gate having a first input terminal coupled to receive the inverted first flag signal, a second input terminal coupled to receive the second flag signal, and an output terminal; and
- a second inverter having an input terminal coupled to the output terminal of the NAND gate and an output terminal that provides the third flag signal.

12. The delay control circuit of claim 9, wherein the locking detector further comprises an output generator coupled to receive the third flag signal and to delay transmission of a locked state of the third flag signal while not delaying transmission of an unlocked state of the third flag signal.

13. The delay control circuit of claim 12, wherein the output block comprises:
- a plurality of serially coupled shift registers, each having a control terminal coupled to receive the reference clock signal, a reset terminal, a data input terminal, and an output terminal, the data input terminal of a first shift register in the plurality of shift registers being coupled to receive the third flag signal; and
- a NAND gate having a respective input terminal coupled to the output terminal of each of the plurality of shift registers, the NAND gate causing the locked state of the third flag signal to be transmitted only when the locked state is shifted through all of the plurality of shift registers.

14. The delay control circuit of claim 12, wherein the output block comprises:
- a plurality of serially coupled shift registers, each having a control terminal coupled to receive the reference clock signal, a reset terminal coupled to receive the third flag signal, a data input terminal, and a data output terminal, the data input terminal of a first shift register in the plurality of shift registers having its data terminal coupled to receive a logic high signal,
- wherein the unlocked state of the third flag signal causes each of the plurality of shift registers to be reset.

15. In a delay locked loop circuit having a delay chain, a method of providing a delay adjustment signal for controlling a delay time, comprising:
- comparing a delayed clock signal generated by the delayed chain to a reference signal, thereby generating a first adjustment signal;
- applying a noise-compensating condition to the first adjustment signal, thereby generating a second adjustment signal;
- comparing the delayed clock signal and the reference signal, thereby generating a locking signal;
- when the locking signal is in a locked state, selecting the second adjustment signal as the delay adjustment signal; and
- when the locking signal is in an unlocked state selecting the first adjustment signal as the delay adjustment signal.

16. The method of claim 15, wherein applying a noise-compensating condition to the first adjustment signal comprises:
- counting a number of occurrences of the first adjustment signal; and
- generating the second adjustment signal when the number of occurrences exceeds a predetermined threshold.

17. The method of claim 15, wherein comparing the delayed clock signal and the reference signal comprises:
- delaying the reference signal by a predetermined time;
- comparing the delayed clock signal to the delayed reference signal;
- generating a first flag signal when the delayed clock signal arrives later than the reference clock signal;
- delaying the delayed clock signal by a predetermined time, thereby producing a second delayed clock signal;
- comparing the reference signal to the second delayed clock signal;
- generating a second flag signal when the reference signal arrives later than the delayed clock signal; and
- generating the locking signal based on the first and second flag signals.

18. The method of claim 15, further comprising:
- delaying for a predetermined time a transition of the locking signal to a locked state, while not delaying a transition of the locking signal to an unlocked state.

* * * * *

(12) EX PARTE REEXAMINATION CERTIFICATE (8952nd)
United States Patent
Han

(10) Number: US 6,556,488 C1
(45) Certificate Issued: Apr. 10, 2012

(54) DELAY LOCKED LOOP FOR USE IN SEMICONDUCTOR MEMORY DEVICE

(75) Inventor: Jong-Hee Han, Ichon-shi (KR)

(73) Assignee: 658868 N.B. Inc., Saint John, NB (CA)

Reexamination Request:
No. 90/012,029, Nov. 30, 2011

Reexamination Certificate for:
Patent No.: 6,556,488
Issued: Apr. 29, 2003
Appl. No.: 09/742,816
Filed: Dec. 19, 2000

(30) Foreign Application Priority Data

Dec. 30, 1999 (KR) .............................. 99-66815

(51) Int. Cl.
*G11C 7/00* (2006.01)

(52) U.S. Cl. ...................... 365/194; 365/233.1; 327/158
(58) Field of Classification Search ........................ None
See application file for complete search history.

(56) References Cited

To view the complete listing of prior art documents cited during the proceeding for Reexamination Control Number 90/012,029, please refer to the USPTO's public Patent Application Information Retrieval (PAIR) system under the Display References tab.

*Primary Examiner* — Karin M. Reichle

(57) ABSTRACT

A delay locked loop is used in a semiconductor memory device. The delay locked loop includes a controllable delay chain block for controlling a delay time of a clock signal coupled thereto, a comparison block for detecting the increase and decrease in the delay time by comparing a reference clock signal with a delayed clock signal generated from the controllable delay chain block, and an instant locking delay control block for controlling the increase and decrease in the delay time of the delay chain block in response to an output signal of the comparison block, the delayed clock signal and the reference clock signal.

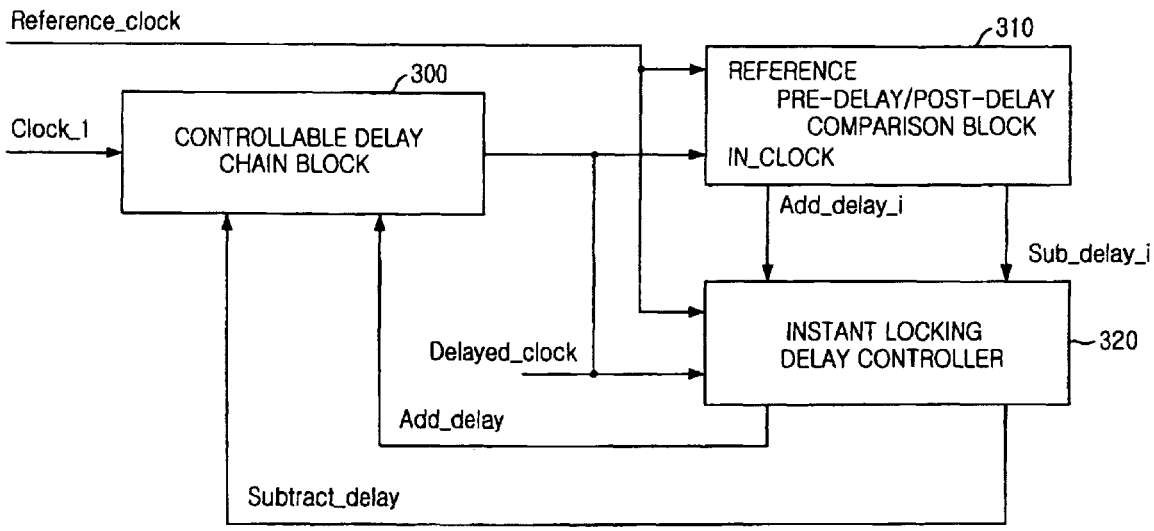

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 7 and 15 is confirmed.

Claims 1-6, 8-14 and 16-18 were not reexamined.

\* \* \* \* \*